United States Patent
Oh et al.

(10) Patent No.: US 11,507,323 B2
(45) Date of Patent: Nov. 22, 2022

(54) MEMORY DEVICE AND OPERATING METHOD THEREOF

(71) Applicant: SK hynix Inc., Gyeonggi-do (KR)

(72) Inventors: Chan Young Oh, Gyeonggi-do (KR); Na Ra Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 1 day.

(21) Appl. No.: 17/374,372

(22) Filed: Jul. 13, 2021

(65) Prior Publication Data

US 2022/0261186 A1 Aug. 18, 2022

(30) Foreign Application Priority Data

Feb. 18, 2021 (KR) .................. 10-2021-0021586

(51) Int. Cl.
*G06F 3/06* (2006.01)

(52) U.S. Cl.
CPC .......... *G06F 3/0659* (2013.01); *G06F 3/0619* (2013.01); *G06F 3/0656* (2013.01); *G06F 3/0679* (2013.01)

(58) Field of Classification Search
CPC .... G06F 3/0659; G06F 3/0619; G06F 3/0656; G06F 3/0679
See application file for complete search history.

(56) References Cited

U.S. PATENT DOCUMENTS

| 6,385,686 | B1* | 5/2002 | Brown | G06F 13/4031 710/305 |
| 2008/0162751 | A1* | 7/2008 | Wilson | G06F 3/04166 710/52 |
| 2013/0080858 | A1* | 3/2013 | Lee | G11C 11/5642 714/E11.054 |
| 2014/0075241 | A1* | 3/2014 | Oh | G06F 11/141 714/15 |
| 2016/0027485 | A1* | 1/2016 | Park | G11C 11/5642 365/189.011 |
| 2017/0070240 | A1* | 3/2017 | Kim | H03M 13/2948 |
| 2018/0038447 | A1* | 2/2018 | Green | F16H 1/22 |
| 2021/0287751 | A1* | 9/2021 | Oh | G11C 29/028 |

FOREIGN PATENT DOCUMENTS

KR  10-2009-0081716 A  7/2009
KR  10-2019-0018324 A  2/2019

* cited by examiner

*Primary Examiner* — Hiep T Nguyen
(74) *Attorney, Agent, or Firm* — IP & T Group LLP

(57) ABSTRACT

Embodiments of the present disclosure relate to a memory device and an operating method thereof. According to the embodiments of the present disclosure, when a read failure for a first read command among a plurality of read commands inputted from a memory controller occurs, the memory device may execute in an overlapping manner, a read retry operation for the first read command and a read operation for a second read command among the plurality of read commands.

13 Claims, 14 Drawing Sheets

MEMORY DEVICE AND OPERATING METHOD THEREOF

CROSS-REFERENCE TO RELATED APPLICATION

The present application claims priority under 35 U.S.C. § 119(a) to Korean Patent Application No. 10-2021-0021586 filed on Feb. 18, 2021, which is incorporated herein by reference in its entirety.

BACKGROUND

1. Technical Field

Various embodiments generally relate to a memory device and an operating method thereof.

2. Related Art

A memory system includes a data storage device that stores is data on the basis of a request from a host, such as a computer, servers, a smartphone, a tablet PC, or other electronic devices. Examples of the memory system span from a traditional magnetic-disk-based hard disk drive (HDD) to a semiconductor-based data storage device such as a solid state drive (SSD), a universal flash storage (UFS) device, or an embedded MMC (eMMC) device.

The memory system may further include a memory controller for controlling a memory device. The memory controller may receive a command from the host and, on the basis of the received command, may execute the command or control read/write/erase operations on one or more memory devices in the memory system. The memory controller may be used to execute firmware operations for performing a logical operation for controlling such operations.

In the case where a read failure occurs during an operation of reading data from the memory device, the memory system may execute a set defense algorithm to normally read the corresponding data. As an example, the memory system may execute a read retry operation to read the corresponding data again while executing various operations designated according to the set defense algorithm.

SUMMARY

Various embodiments of the present disclosure are directed to a memory device and an operating method thereof, capable of minimizing a decrease in read performance when a read failure occurs while a plurality of read commands are processed.

In one aspect, embodiments of the present disclosure may provide a memory device executing a plurality of read commands inputted from a memory controller.

The memory device may include a memory cell array, a read/write circuit configured to read data stored in the memory cell array, and a control logic configured to control the read/write circuit to execute a plurality of read commands inputted from a memory controller.

When a read failure for a first read command among the plurality of read commands occurs, the memory device may execute, in an overlapping manner, a read retry operation for the first read command and a read operation for a second read command among the plurality of read commands.

The memory device may include a cache buffer which caches data read-requested by the plurality of read commands, and may simultaneously execute an operation of caching first data, as data read in the read retry operation for the first read command, in the cache buffer and an operation of outputting second data, as data read-requested by the second read command, to the memory controller.

In another aspect, embodiments of the present disclosure may provide a method for operating a memory device executing a plurality of read commands inputted from a memory controller.

The method for operating a memory device may include monitoring whether a read failure for a first read command among the plurality of read commands has occurred.

The method for operating a memory device may include executing, when a read failure for the first read command has occurred, a read retry operation for the first read command and a read operation for a second read command among the plurality of read commands in an overlapping manner.

In another aspect, embodiments of the present disclosure may provide a memory device including a memory cell array including a plurality of pages, a cache buffer and a control logic.

The control logic may receive, from a memory controller, a plurality of read commands associated with the plurality of pages.

The control logic may sequentially execute first and second read commands among the plurality of read commands to read first and second data from first and second pages among the plurality of pages and cache first and second read data in the cache buffer.

The control logic may determine whether a read failure for the first read data has occurred.

When it is determined the read failure for the first read data occurred, the control logic may execute a read retry for the first page to read the first read data and cache the first read data in the cache buffer while transferring the second read data, which is cached in the cache buffer, to the memory controller According to the embodiments of the present disclosure, it is possible to minimize a decrease in performance when a read failure occurs while a plurality of read commands are processed.

DETAILED DESCRIPTION

Hereinafter, embodiments of the present disclosure are described in detail with reference to the accompanying drawings.

Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Figure 1:
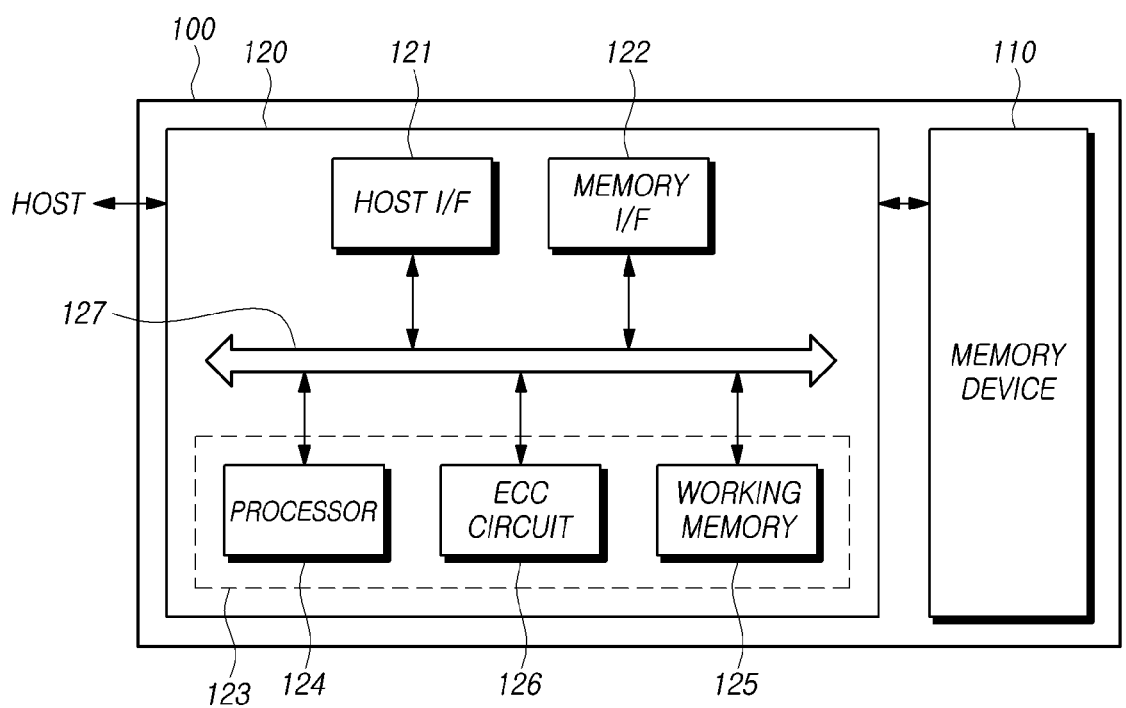
FIG. 1 is a schematic diagram illustrating a configuration of a memory system based on an embodiment of the present disclosure.

FIG. 1 is a diagram illustrating the schematic configuration of a memory system 100 based on an embodiment of the present disclosure.

In some implementations, the memory system 100 may include a memory device 110 configured to store data, and a memory controller 120 configured to control the memory device 110.

The memory device 110 may include multiple memory blocks each including a plurality of memory cells for storing data. The memory device 110 may be configured to operate in response to control signals received from the memory controller 120. Operations of the memory device 110 may include, for example, a read operation, a program operation (also referred to as a "write operation"), an erase operation, and the like.

The memory cells in the memory device 110 are used to store data and may be arranged in a memory cell array. The memory cell array may be divided into memory blocks of memory cells and each block includes different pages of memory cells. In typical implementations of NAND flash memory devices, a page of memory cells is the smallest memory unit that can be programmed or written, and the data stored in memory cells can be erased at the block level.

In some implementations, the memory device 110 may be implemented as various types, such as a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), or a spin transfer torque random access memory (STT-RAM).

The memory device 110 may be implemented in a three-dimensional array structure. Some embodiments of the present disclosure are applicable to any type of flash memory devices having an electric charge storage layer. In an implementation, the electric charge storage layer may be formed of a conductive material, and such an electric charge storage layer can be called a floating gate. In another implementation, the electric charge storage layer may be formed of an insulating material, and such a flash memory device can be called a charge trap flash (CTF).

The memory device 110 may be configured to receive a command and an address from the memory controller 120 to access an area of the memory cell array selected using the address. That is, the memory device 110 may perform an operation corresponding to the received command on a memory area of the memory device having a physical address corresponding to the received address from the memory controller 120.

In some implementations, the memory device 110 may perform a program operation, a read operation, an erase operation, and the like. During the program operation, the memory device 110 may write data in the area selected by the address. During the read operation, the memory device 110 may read data from a memory area selected by the address. During the erase operation, the memory device 110 may erase data stored in a memory area selected by the address.

The memory controller 120 may control write (program), read, erase, and background operations that are performed on the memory device 110. The background operation may include, for example, operations that are implemented to optimize the overall performance of the memory device 110, such as a garbage collection (GC) operation, a wear leveling (WL) operation, and a bad block management (BBM) operation.

The memory controller 120 may control the operation of the memory device 110 at the request of a host. Alternatively, the memory controller 120 may control the operation of the memory device 110 even in absence of request from the host when it performs such background operations of the memory device.

The memory controller 120 and the host may be separate devices. In some implementations, the memory controller 120 and the host may be integrated and implemented as a single device. In the following description, the memory controller 120 and the host will be discussed as separate devices as an example.

Referring to FIG. 1, the memory controller 120 may include a host interface 121, a memory interface 122, and a control circuit 123.

The host interface 121 may be configured to provide an interface for communication with the host.

When receiving a command from the host HOST, the control circuit 123 may receive the command through the host interface 121 and may perform an operation of processing the received command.

The memory interface 122 may be directly or indirectly connected to the memory device 110 to provide an interface for communication with the memory device 110. That is, the memory interface 122 may be configured to provide the memory device 110 and the memory controller 120 with an interface for the memory controller 120 to perform memory operations on the memory device 110 based on control signals and instructions from the control circuit 123.

The control circuit 123 may be configured to control the operation of the memory device 110 through the memory controller 120. For example, the control circuit 123 may include a processor 124 and a working memory 125. The control circuit 123 may further include an error detection/correction circuit (ECC circuit) 126 and the like.

The processor 124 may control the overall operation of the memory controller 120. The processor 124 may perform a logical operation. The processor 124 may communicate with the host HOST through the host interface 121. The processor 124 may communicate with the memory device 110 through the memory interface 122.

The processor 124 may be used to perform operations associated with a flash translation layer (FTL) to effectively manage the memory operations on the memory system 100. The processor 124 may translate a logical block address (LBA) provided by the host into a physical block address (PBA) through the FTL. The FTL may receive the LBA and translate the LBA into the PBA by using a mapping table.

There are various address mapping methods which may be employed by the FTL, based on the mapping unit. Typical address mapping methods may include a page mapping method, a block mapping method, and a hybrid mapping method.

The processor 124 may be configured to randomize data received from the host and to write the randomized data to the memory cell array. For example, the processor 124 may randomize data received from the host by using a randomizing seed. The randomized data is provided to the memory device 110 and written to the memory cell array.

The processor 124 may be configured to derandomize data received from the memory device 110 during a read operation. For example, the processor 124 may derandomize data received from the memory device 110 by using a derandomizing seed. The derandomized data may be output to the host HOST.

The processor 124 may execute firmware (FW) to control the operation of the memory controller 120. The processor 124 may control the overall operation of the memory controller 120 and, in order to perform a logical operation, may execute (drive) firmware loaded into the working memory 125 during booting.

The firmware refers to a program or software stored on a certain nonvolatile memory and is executed inside the memory system 100.

In some implementations, the firmware may include various functional layers. For example, the firmware may include at least one of a flash translation layer (FTL) configured to translate a logical address in the host HOST requests to a physical address of the memory device 110, a host interface layer (HIL) configured to interpret a command that the host HOST issues to a data storage device such as the memory system 100 and to deliver the command to the FTL, and a flash interface layer (FIL) configured to deliver a command issued by the FTL to the memory device 110.

For example, the firmware may be stored in the memory device 110, and then loaded into the working memory 125.

The working memory 125 may store firmware, program codes, commands, or pieces of data necessary to operate the memory controller 120. The working memory 125 may include, for example, at least one of a static RAM (SRAM), a dynamic RAM (DRAM), and a synchronous RAM (SDRAM) as a volatile memory.

The error detection/correction circuit 126 may be configured to detect and correct one or more erroneous bits in the data by using an error detection and correction code. In some implementations, the data that is subject to the error detection and correction may include data stored in the working memory 125, and data retrieved from the memory device 110.

The error detection/correction circuit 126 may be implemented to decode data by using the error correction code. The error detection/correction circuit 126 may be implemented by using various decoding schemes. For example, a decoder that performs nonsystematic code decoding or a decoder that performs systematic code decoding may be used.

In some implementations, the error detection/correction circuit 126 may detect one or more erroneous bits on a sector basis. That is, each piece of read data may include multiple sectors. In the present disclosure, a sector may refer to a data unit that is smaller than the read unit (e.g., page) of a flash memory. Sectors constituting each piece of read data may be mapped based on addresses.

In some implementations, the error detection/correction circuit 126 may calculate a bit error rate (BER) and determine whether the number of erroneous bits in the data is within the error correction capability sector by sector. For example, if the BER is higher than a reference value, the error detection/correction circuit 126 may determine that the erroneous bits in the corresponding sector are uncorrectable and the corresponding sector is marked "fail." If the BER is lower than or equals to the reference value, the error detection/correction circuit 126 may determine that the corresponding sector is correctable or the corresponding sector can be marked "pass."

The error detection/correction circuit 126 may perform error detection and correction operations successively on all read data. When a sector included in the read data is correctable, the error detection/correction circuit 126 may move on to the next sector to check whether an error correction operation is needed on the next sector. Upon completion of the error detection and correction operations on all the read data in this manner, the error detection/correction circuit 126 may acquire information as to which sector is deemed uncorrectable in the read data. The error detection/correction circuit 126 may provide such information (e.g., address of uncorrectable bits) to the processor 124.

The memory system 100 may also include a bus 127 to provide a channel between the constituent elements 121, 122, 124, 125, and 126 of the memory controller 120. The bus 127 may include, for example, a control bus for delivering various types of control signals and commands, and a data bus for delivering various types of data.

By way of example, FIG. 1 illustrates the above-mentioned constituent elements 121, 122, 124, 125, and 126 of the memory controller 120. It is noted that some of those illustrated in the drawings may be omitted, or some of the above-mentioned constituent elements 121, 122, 124, 125, and 126 of the memory controller 120 may be integrated into a single element. In addition, in some implementations, one or more other constituent elements may be added to the above-mentioned constituent elements of the memory controller 120.

Figure 2:
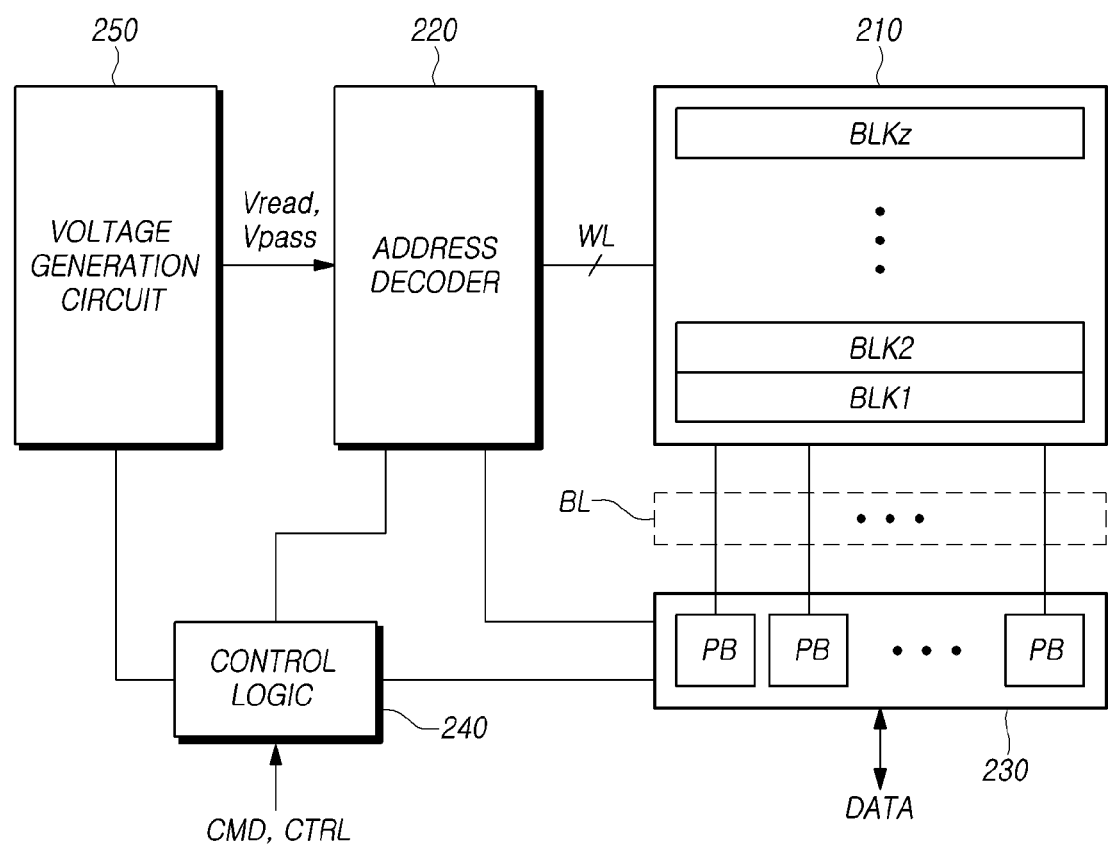
FIG. 2 is a block diagram schematically illustrating a memory device based on an embodiment of the present disclosure.

FIG. 2 is a block diagram schematically illustrating a memory device 110 based on an embodiment of the present disclosure.

In some implementations, the memory device 110 of the present disclosure may include a memory cell array 210, an address decoder 220, a read/write circuit 230, a control logic 240, and a voltage generation circuit 250.

The memory cell array 210 may include multiple memory blocks BLK1-BLKz, where z is a natural number greater than or equal to 2.

In the multiple memory blocks BLK1-BLKz, multiple word lines WL and multiple bit lines BL may be disposed in rows and columns, and multiple memory cells MC may be arranged.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells are nonvolatile memory cells. In some implementations, such nonvolatile memory cells may be arranged in a vertical channel structure.

The memory cell array 210 may be configured as a memory cell array having a two-dimensional structure. In some implementations, the memory cell array 210 may be arranged in a three-dimensional structure.

Each of the multiple memory cells included in the memory cell array 210 may store at least one bit of data. For example, each of the multiple memory cells included in the memory cell array 210 may be a single-level cell (SLC) configured to store one bit of data. As another example, each of the multiple memory cells included in the memory cell array 210 may be a multi-level cell (MLC) configured to store two bits of data per memory cell. As another example, each of the multiple memory cells included in the memory cell array 210 may be a triple-level cell (TLC) configured to store three bits of data per memory cell. As another example, each of the multiple memory cells included in the memory cell array 210 may be a quad-level cell (QLC) configured to store four bits of data per memory cell. As another example, the memory cell array 210 may include multiple memory cells, each of which may be configured to store at least five bits of data per memory cell.

Referring to FIG. 2, the address decoder 220, the read/write circuit 230, the control logic 240, and the voltage generation circuit 250 may operate as peripheral circuits configured to drive the memory cell array 210.

The address decoder 220 may be connected to the memory cell array 210 through the multiple word lines WL.

The address decoder 220 may be configured to operate in response to command and control signals of the control logic 240.

The address decoder 220 may receive addresses through an input/output buffer (not shown) inside the memory device 110. The address decoder 220 may be configured to decode a block address among the received addresses. The address decoder 220 may select at least one memory block based on the decoded block address.

The address decoder 220 may receive a read voltage Vread and a pass voltage Vpass from the voltage generation circuit 250.

The address decoder 220 may, during a read operation, apply the read voltage Vread to a selected word line WL inside a selected memory block and apply the pass voltage Vpass to the remaining non-selected word lines WL.

The address decoder 220 may apply a verification voltage generated by the voltage generation circuit 250 to a selected word line WL inside a selected memory block, during a program verification operation, and may apply the pass voltage Vpass to the remaining non-selected word lines WL.

The address decoder 220 may be configured to decode a column address among the received addresses. The address decoder 220 may transmit the decoded column address to the read/write circuit 230.

The memory device 110 may perform the read operation and the program operation page by page. Addresses received when the read operation and the program operation are requested may include at least one of a block address, a row address, and a column address.

The address decoder 220 may select one memory block and one word line based on the block address and the row address. The column address may be decoded by the address decoder 220 and provided to the read/write circuit 230.

The address decoder 220 may include at least one of a block decoder, a row decoder, a column decoder, and an address buffer.

The read/write circuit 230 may include multiple page buffers PB. The read/write circuit 230 may operate as a "read circuit" when the memory cell array 210 performs a read operation, and may operate as a "write circuit" when the memory cell array 210 performs a write operation.

The above-mentioned read/write circuit 230 is also referred to as a page buffer circuit including multiple page buffers PB, or a data register circuit. The read/write circuit 230 may include a data buffer that participates in a data processing function and, in some implementations, may further include a cache buffer for data caching.

The multiple page buffers PB may be connected to the memory cell array 210 through the multiple bit lines BL. In order to detect or sense the threshold voltage Vth of the memory cells during a read operation and a program verification operation, the multiple page buffers PB may continuously supply a sensing current to the bit lines BL connected to the memory cells to detect at a sensing node, a change proportional to the amount of current that varies depending on the program state of a corresponding memory cell, and may hold or latch the corresponding voltage as sensing data.

The read/write circuit 230 may operate in response to page buffer control signals output from the control logic 240.

During a read operation, the read/write circuit 230 senses a voltage value of a memory cell and the voltage value is read out as data. The read/write circuit 230 temporarily stores the retrieved data, and outputs the data DATA to the input/output buffer of the memory device 110. In an embodiment, the read/write circuit 230 may include a column selection circuit, in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control the overall operation of the memory device 110 in response to the control signal CTRL. The control logic 240 may output a control signal for adjusting the voltage level of sensing nodes of multiple page buffers PB to a pre-charge voltage level.

The control logic 240 may control the read/write circuit 230 to perform a read operation on the memory cell array 210. The voltage generation circuit 250 may generate a read voltage Vread and a pass voltage Vpass, which are used during the read operation, in response to a voltage generation circuit control signal output from the control logic 240.

A memory block BLK included in the memory device 110 may include multiple pages PG. In some implementations, a plurality of memory cells arranged in columns form memory cell strings, and a plurality of memory cells arranged in rows form memory blocks. Each of the multiple pages PG is coupled to one of word lines WL, and each of the memory cell strings STR is coupled to one of bit lines BL.

In the memory block BLK, multiple word lines WL and multiple bit lines BL may be arranged in rows and columns. For example, each of the multiple word lines WL may be arranged in the row direction, and each of the multiple bit lines BL may be arranged in the column direction. As another example, each of the multiple word lines WL may be arranged in the column direction, and each of the multiple bit lines BL may be arranged in the row direction.

In some implementations, the multiple word lines WL and the multiple bit lines BL may intersect with each other, thereby addressing a single memory cell in the array of multiple memory cells MC. In some implementations, each memory cell MC may include a transistor TR that includes a material layer that can hold an electrical charge.

For example, the transistor TR arranged in each memory cell MC may include a drain, a source, and a gate. The drain (or source) of the transistor TR may be connected to the corresponding bit line BL directly or via another transistor TR. The source (or drain) of the transistor TR may be connected to the source line (which may be the ground) directly or via another transistor TR. The gate of the transistor TR may include a floating gate (FG) surrounded by an insulator, and a control gate (CG) to which a gate voltage is applied from a word line WL.

In each of the multiple memory blocks BLK1-BLKz, a first selection line (also referred to as a source selection line or a drain selection line) may be additionally arranged outside the first outermost word line, which is closer to the read/write circuit 230 among two outermost word lines, and a second selection line (also referred to as a drain selection line or a source selection line) may be additionally arranged outside the other second outermost word line.

In some implementations, at least one dummy word line may be additionally arranged between the first outermost word line and the first selection line. In addition, at least one dummy word line may be additionally arranged between the second outermost word line and the second selection line.

A read operation and a program operation (write operation) of the memory block may be performed page by page, and an erase operation may be performed memory block by memory block.

Figure 3:
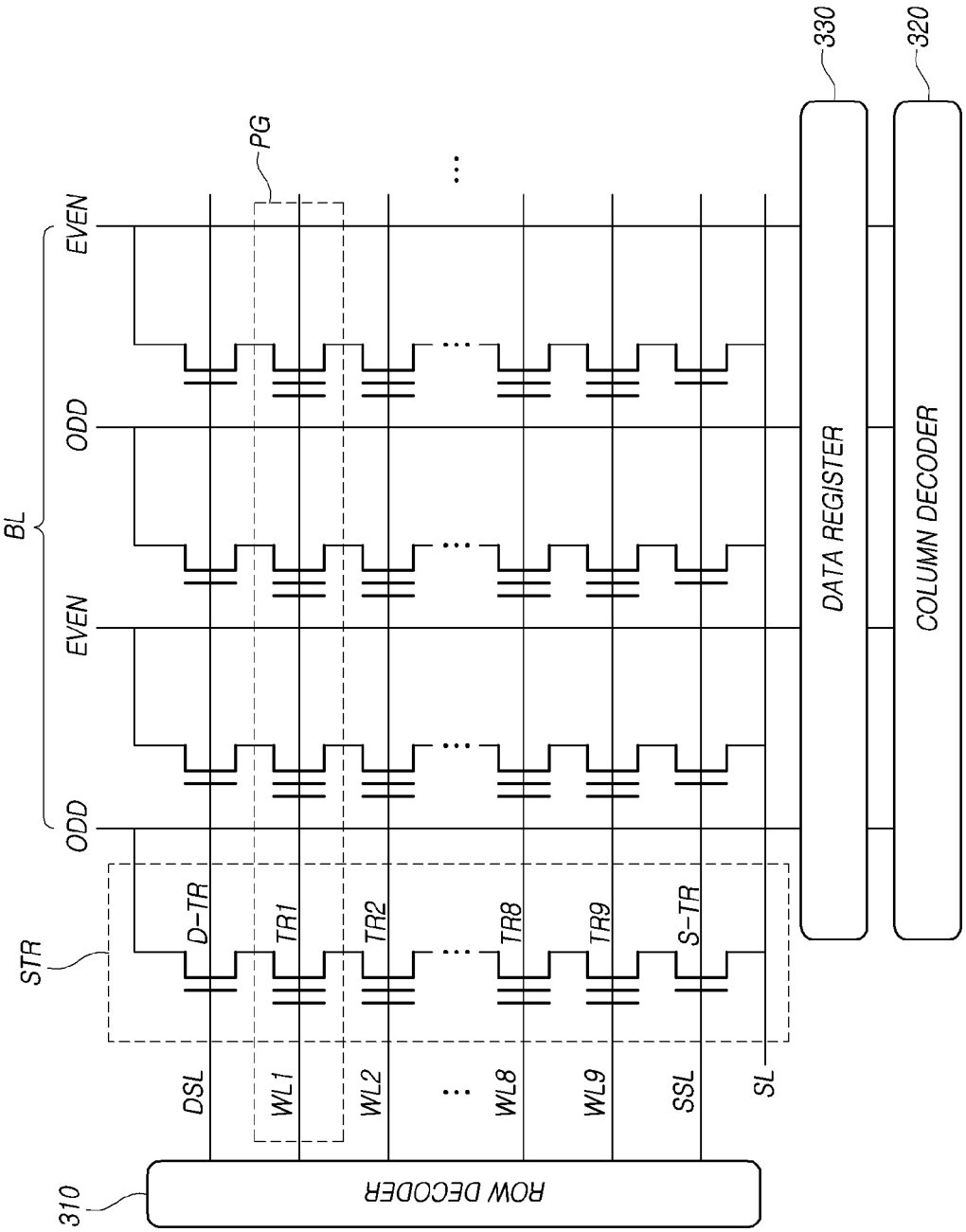
FIG. 3 is a diagram illustrating a structure of word lines and bit lines of a memory device based on an embodiment of the present disclosure.

FIG. 3 is a diagram illustrating a structure of word lines WL and bit lines BL of a memory device 110 based on an embodiment of the present disclosure.

Referring to FIG. 3, the memory device 110 has a core area in which memory cells MC are arranged, and an auxiliary area (the remaining area other than the core area) to include circuitry that is used to perform the operations of the memory cell array 210.

In the core area, a certain number of memory cells arranged in one direction can be called a "page" PG, and a certain number of memory cells that are coupled in series can be called a "memory cell string" STR.

The word lines WL1-WL9 may be connected to a row decoder 310. The bit lines BL may be connected to a column decoder 320. A data register 330, which corresponds to the read/write circuit 230 of FIG. 2, may exist between the multiple bit lines BL and the column decoder 320.

The multiple word lines WL1-WL9 may correspond to multiple pages PG.

For example, each of the multiple word lines WL1-WL9 may correspond to one page PG as illustrated in FIG. 3. When each of the multiple word lines WL1-WL9 has a large size, each of the multiple word lines WL1-WL9 may correspond to at least two (e.g., two or four) pages PG. Each page PG is the smallest unit in a program operation and a read operation, and all memory cells MC within the same page PG may perform simultaneous operations when conducting a program operation and a read operation.

The multiple bit lines BL may be connected to the column decoder 320. In some implementations, the multiple bit lines BL may be divided into odd-numbered bit lines BL and even-numbered bit lines BL such that a pair of odd-numbered bit line and even-numbered bit line is coupled in common to a column decoder 320.

In accessing a memory cell MC, the row decoder 310 and the column decoder 320 are used to locate a desired memory cell based on the address.

In some implementations, the data register 330 plays an important role because all data processing by the memory device 110, including program and read operations, occurs via the data register 330. If data processing by the data register 330 is delayed, all of the other areas need to wait until the data register 330 finishes the data processing, degrading the overall performance of the memory device 110.

Referring to the example illustrated in FIG. 3, in one memory cell string STR, multiple transistors TR1-TR9 may be connected to multiple word lines WL1-WL9, respectively. In some implementations, the multiple transistors TR1-TR9 correspond to memory cells MC. In this example, the multiple transistors TR1-TR9 include control gates CG and floating gates FG.

The multiple word lines WL1-WL9 include two outermost word lines WL1 and WL9. A first selection line DSL may be additionally arranged outside the first outermost word line WL1, which is closer to the data register 330 and has a shorter signal path compared to the other outermost word line WL9. A second selection line SSL may be additionally arranged outside the other second outermost word line WL9.

The first selection transistor D-TR, which is controlled to turn on/off by the first selection line DSL, has a gate electrode connected to the first selection line DSL, but includes no floating gate FG. The second selection transistor S-TR, which is controlled to turn on/off by the second selection line SSL, has a gate electrode connected to the second selection line SSL, but includes no floating gate FG.

The first selection transistor D-TR is used as a switch circuit that connects the corresponding memory cell string STR to the data register 330. The second selection transistor S-TR is used as a switch that connects the corresponding memory cell string STR to the source line SL. That is, the first selection transistor D-TR and the second selection transistor S-TR can be used to enable or disable the corresponding memory cell string STR.

In some implementations, the memory system 100 applies a predetermined turn-on voltage Vcc to the gate electrode of the first selection transistor D-TR, thereby turning on the first selection transistor D-TR, and applies a predetermined turn-off voltage (e.g., 0V) to the gate electrode of the second selection transistor S-TR, thereby turning off the second selection transistor S-TR.

The memory system 100 turns on both of the first and second selection transistors D-TR and S-TR during a read operation or a verification operation. Accordingly, during a read operation or a verification operation, an electric current may flow through the corresponding memory cell string STR and drain to the source line SL, which corresponds to the ground, such that the voltage level of the bit line BL can be measured. However, during a read operation, there may be a time difference in the on/off timing between the first selection transistor D-TR and the second selection transistor S-TR.

The memory system 100 may apply a predetermined voltage (e.g., +20V) to the substrate through a source line SL during an erase operation. The memory system 100 applies a certain voltage to allow both the first selection transistor D-TR and the second selection transistor S-TR to float during an erase operation. As a result, the applied erasure voltage can remove electrical charges from the floating gates FG of the selected memory cells.

Figure 4:
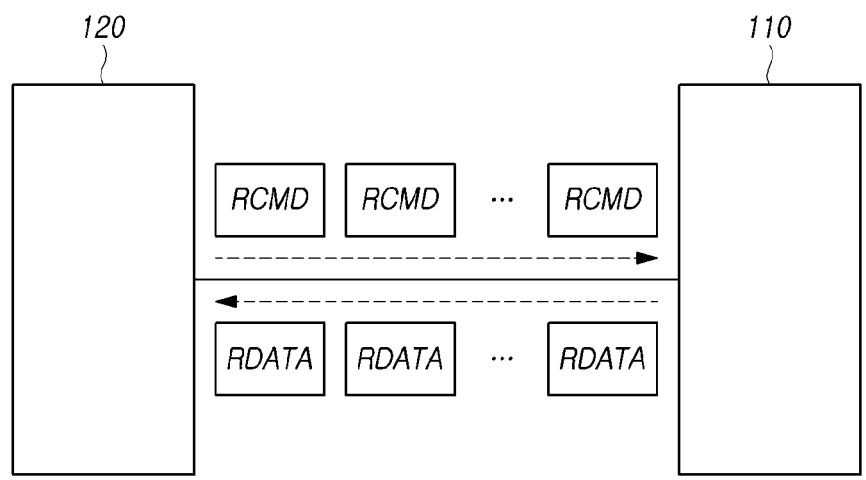
FIG. 4 is a diagram illustrating a schematic operation of a memory device based on an embodiment of the present disclosure.

FIG. 4 is a diagram illustrating a schematic operation of a memory device 110 based on an embodiment of the present disclosure.

Referring to FIG. 4, the memory device 110 may receive a plurality of read commands RCMD from a memory controller 120. The plurality of read commands RCMD may be commands which request the memory device 110 to read data stored in different pages included in the memory device 110. The memory device 110 may separately receive an address associated with data read-requested by each of the plurality of read commands RCMD, from the memory controller 120.

Address values associated with data read-requested by the plurality of read commands RCMD may be, for example, values that sequentially increase or decrease. Thus, an address at which data read-requested by a read command RCMD inputted for an (N+1)th time (where N is a natural number) to the memory device 110 among the plurality of read commands RCMD is stored may be successive to an address at which data read-requested by a read command RCMD inputted for an Nth time to the memory device 110 among the plurality of read commands RCMD is stored. By receiving the plurality of read commands RCMD, the memory device 110 may read data stored in successive addresses which sequentially increase or decrease.

The memory device 110 may execute the plurality of read commands RCMD received from the memory controller 120. Further, the memory device 110 may output read data RDATA, corresponding to each of the plurality of executed read commands RCMD, to the memory controller 120.

The memory device 110 may sequentially execute the plurality of read commands RCMD one by one. Alternatively, the memory device 110 may execute two different read commands among the plurality of read commands RCMD in an overlapping manner.

When the memory device 110 sequentially executes the plurality of read commands RCMD one by one, the memory device 110 may receive one read command RCMD among the plurality of read commands RCMD, may read data from an address at which data read-requested by the corresponding read command RCMD is stored, and may output the read data to the memory controller 120. When the operation of outputting the read data to the memory controller 120 is completed, the memory device 110 may execute an operation of processing another one of the plurality of read commands RCMD. As such, an operation in which the memory device 110 processes the read commands RCMD one by one may be referred to as a normal read operation.

On the other hand, when the memory device 110 executes two different read commands RCMD among the plurality of read commands RCMD in an overlapping manner, the memory device 110 may execute a part of a read operation for one of the two read commands RCMD and at the same time may execute a part of a read operation for the other of the two read commands RCMD.

Hereinbelow, an example of an operation in which the memory device 110 executes read commands in an overlapping manner will be described with reference to FIG. 5.

Figure 5:
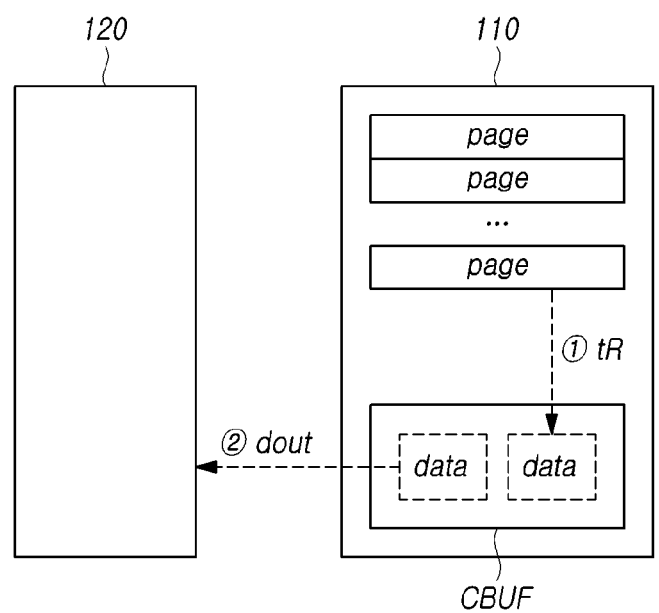
FIG. 5 is a diagram illustrating an example of an operation in which a memory device based on an embodiment of the present disclosure executes two read commands in an overlapping manner.

FIG. 5 is a diagram illustrating an example of an operation in which a memory device 110 based on an embodiment of the present disclosure executes two read commands in an overlapping manner. The operation of FIG. 5 may be performed under the control of the control logic 240 in FIG. 2.

Referring to FIG. 5, the memory device 110 may include a cache buffer CBUF capable of caching data read-requested by an inputted read command. The cache buffer CBUF may temporarily store the data read-requested by the inputted read command, and then, may output the temporarily stored data to the memory controller 120.

The cache buffer CBUF may be, for example, the page buffer PB described above with reference to FIG. 2 or a separate volatile memory (e.g., an SRAM, a DRAM or an SDRAM) capable of caching data. The cache buffer CBUF may cache data by the unit of page.

When executing a read operation for a read command, the memory device 110 may first read data stored in a page in the memory device 110 and then cache the read data in the cache buffer CBUF (① tR).

Further, the memory device 110 may output data, cached in the cache buffer CBUF, to the memory controller 120 (② dout).

At this time, while executing the operation ① of caching data, stored in a page in the memory device 110, in the cache buffer CBUF, the memory device 110 may simultaneously execute the operation ② of outputting another data, previously stored in the cache buffer CBUF, to the memory controller 120.

That is, the memory device 110 may execute the two read commands in an overlapping manner by simultaneously executing 1) an operation of caching data, read-requested by one of two read commands, in the cache buffer CBUF and 2) an operation of outputting data, read-requested by the other of the two read commands, to the memory controller 120. As such, an operation in which the memory device 110 executes two read commands in an overlapping manner may be referred to as a cache read operation.

In this way, by executing two read commands in an overlapping manner, the memory device 110 may process a plurality of inputted read commands faster. This is because, while the memory device 110 outputs data, previously stored in the cache buffer CBUF, to the memory controller 120, an operation of executing another read command is not interrupted.

Figure 6:
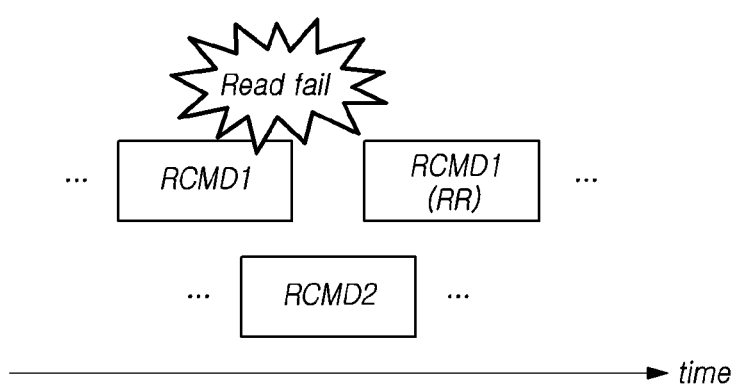
FIG. 6 is a diagram illustrating an example of an operation in which a memory device based on an embodiment of the present disclosure executes a read command.

FIG. 6 is a diagram illustrating an example of an operation in which a memory device 110 based on an embodiment of the present disclosure executes a read command. The operation of FIG. 6 may be performed under the control of the control logic 240 in FIG. 2.

Referring to FIG. 6, when a read failure occurs during a read operation for a first read command RCMD1 among a plurality of read commands received from the memory controller 120, the memory device 110 may execute a read retry (RR) operation for the first read command RCMD1, according to a request of the memory controller 120. For example, when the read retry operation for the first read command RCMD1 is executed, the memory device 110 may read again data read-requested by the first read command RCMD1, after changing a specific setting value (e.g., the number/magnitudes of read voltages used in the read retry operation).

In order to execute the read retry operation for the first read command RCMD1, the memory device 110 may receive, for example, from the memory controller 120, a command which requests the read retry operation for the first read command RCMD1. In this case, the memory device 110 may transmit, to the memory controller 120, a response that a read failure for the first read command RCMD1 has occurred, so that the memory controller 120 may generate the command which requests the read retry operation for the first read command RCMD1.

As another example, when a read failure occurs during the read operation for the first read command RCMD1, the memory device 110 may execute by itself the read retry operation for the first read command RCMD1. In this case, the memory device 110 does not need to transmit, to the memory controller 120, a response that a read failure for the first read command RCMD1 has occurred.

The memory device 110 may not execute solely the above-described read retry operation for the first read command RCMD1. Instead, the memory device 110 may execute the read retry operation for the first read command RCMD1, in an overlapping manner with a read operation for another read command among the plurality of read commands received from the memory controller 120.

In FIG. 6, the memory device 110 may execute the read retry operation (RR) for the first read command RCMD1 and a read operation for a second read command RCMD2 in an overlapping manner. Therefore, even when a read failure occurs during the read operation for the first read command RCMD1, the memory device 110 does not interrupt executing read operations in an overlapping manner.

A reason why, in this way, the memory device 110 executes the read retry operation for the first read command RCMD1 and the read operation for the second read command RCMD2 in an overlapping manner is as follows.

If the memory device 110 executes solely the read retry operation for the first read command RCMD1 instead of executing the read retry operation for the first read command RCMD1 in an overlapping manner with a read operation for another read command, the read operation for the another read command may not be executed while the read retry operation for the first read command RCMD1 is executed, and may be executed after the read retry operation for the first read command RCMD1 is completed. Accordingly, the memory device 110 cannot improve read performance as an effect obtained by executing different read commands in an overlapping manner.

Thus, by executing the read retry operation for the first read command RCMD1 as well in an overlapping manner with a read operation for another read command, the memory device 110 may prevent overall read performance from decreasing even when a read failure occurs.

However, when the memory device 110 executes the read retry operation for the first read command RCMD1, in the case where there is no other read command which may be executed in an overlapping manner with the read retry operation for the first read command RCMD1, the memory device 110 may execute solely the read retry operation for the first read command RCMD1, without waiting for another read command to be executed in an overlapping manner.

Figure 7:
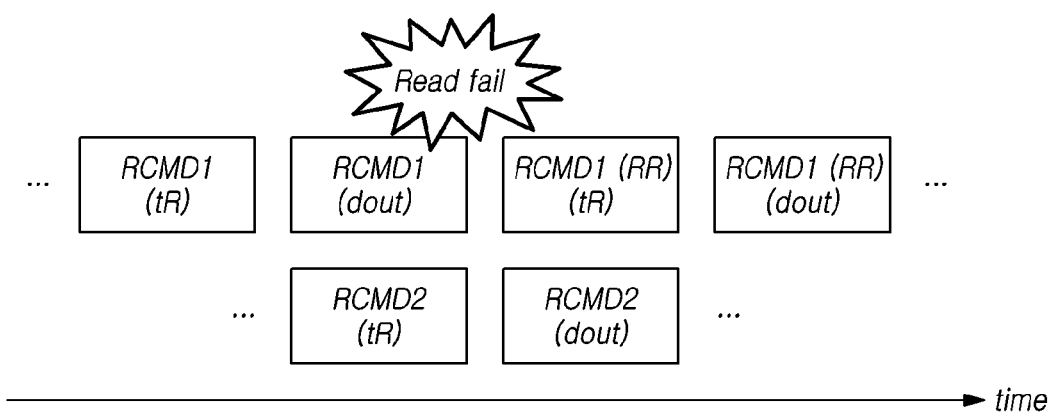
FIGS. 7 and 8 are diagrams illustrating an example in which a memory device based on an embodiment of the present disclosure executes a read retry operation for a first read command and a second read command in an overlapping manner.
Figure 8:
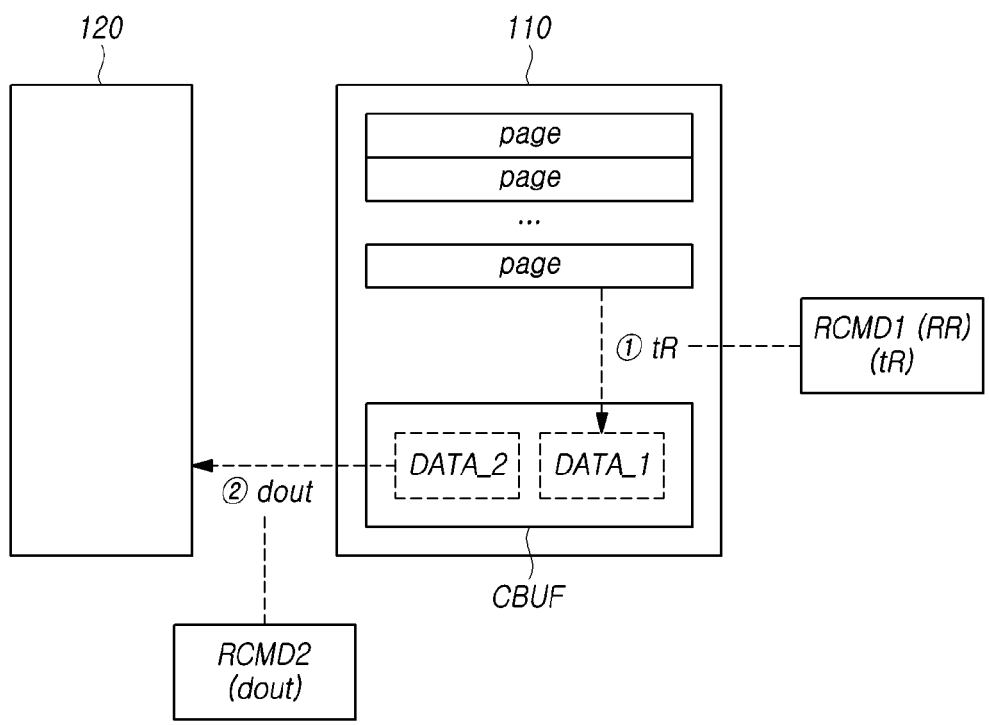

FIGS. 7 and 8 are diagrams illustrating an example in which a memory device 110 based on an embodiment of the present disclosure executes a read retry operation (RR) for a first read command RCMD1 and a second read command RCMD2 in an overlapping manner. The operations of FIGS. 7 and 8 may be performed under the control of the control logic 240 in FIG. 2.

Referring to FIG. 7, a read failure has occurred while the memory device 110 executes a read operation for the first read command RCMD1. At this time, the memory device 110 is executing an operation of caching data, read-requested by the second read command RCMD2, in the cache buffer CBUF.

Thereafter, the memory device 110 may simultaneously execute an operation (tR) of caching data read in the read retry operation (RR) for the first read command RCMD1, in the cache buffer CBUF and an operation (dout) of outputting the data read-requested by the second read command RCMD2, to the memory controller 120.

Hereinbelow, a process in which the memory device 110 executes the operation described above with reference to FIG. 7 will be described with reference to FIG. 8.

Referring to FIG. 8, in the read retry operation (RR) for the first read command RCMD1, the memory device 110 reads data from a page in the memory device 110, and caches first data DATA_1, as the read data, in the cache buffer CBUF (① tR).

At this time, second data DATA_2, as the data read-requested by the second read command RCMD2, may be in a state in which it is previously stored in the cache buffer CBUF. Before executing the read retry operation for the first read command RCMD1, the memory device 110 is in a state in which it has already executed an operation of caching the second data DATA_2.

The memory device 110 may execute an operation (② dout) of outputting the second data DATA_2, previously stored in the cache buffer CBUF, to the memory controller 120, simultaneously with the operation of caching the first data DATA_1 in the cache buffer CBUF.

Furthermore, the memory device 110 may execute the read retry operation for the first read command RCMD1 in an overlapping manner with not only the second read command RCMD2 but also another read command.

Figure 9:
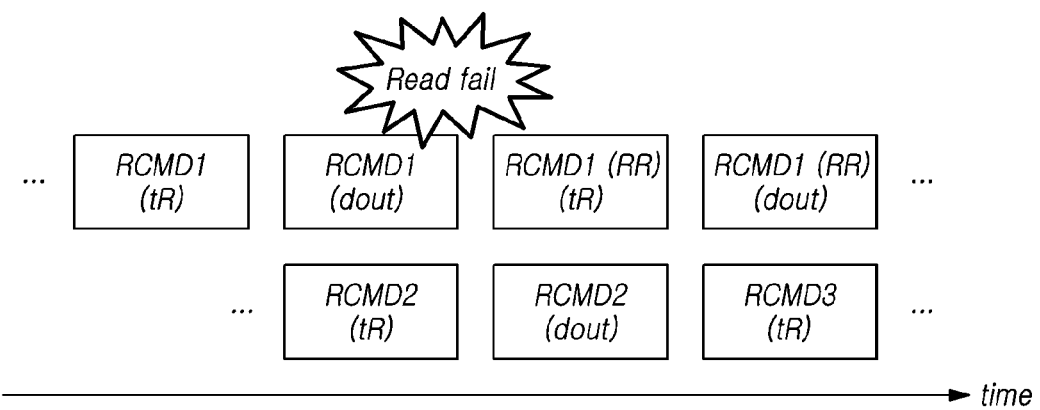
FIGS. 9 and 10 are diagrams illustrating an example in which a memory device based on an embodiment of the present disclosure executes a read retry operation for a first read command and a third read command in an overlapping manner.
Figure 10:
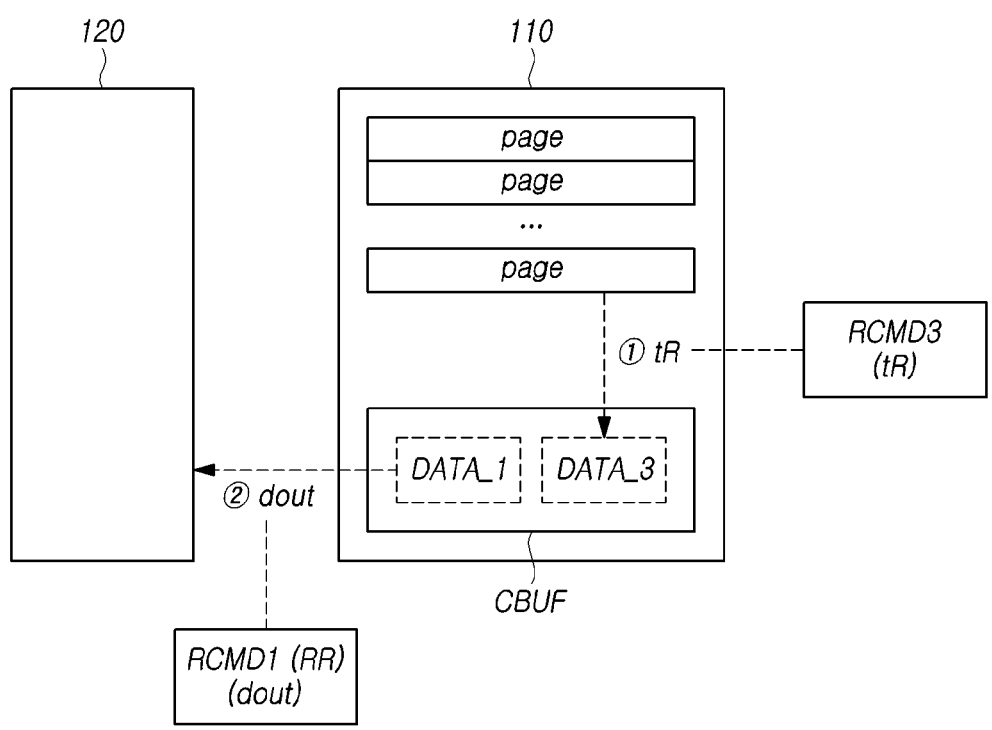

FIGS. 9 and 10 are diagrams illustrating an example in which a memory device 110 based on an embodiment of the present disclosure executes a read retry operation (RR) for a first read command RCMD1 and a third read command RCMD3 in an overlapping manner. The operations of FIGS. 9 and 10 may be performed under the control of the control logic 240 in FIG. 2.

Referring to FIG. 9, the memory device 110 may simultaneously execute an operation (tR) of caching data, read in the read retry operation for the first read command RCMD1, in the cache buffer CBUF and an operation (dout) of outputting data, read-requested by a second read command RCMD2, to the memory controller 120.

Thereafter, the memory device 110 may simultaneously execute an operation (dout) of outputting the data, read in the read retry operation for the first read command RCMD1, to the memory controller 120 and an operation (tR) of caching data, read-requested by the third read command RCMD3 among a plurality of read commands inputted from the memory controller 120, in the cache buffer CBUF.

Hereinbelow, a process in which the memory device 110 executes the operation described above with reference to FIG. 9 will be described with reference to FIG. 10.

Referring to FIG. 10, in a read operation for the third read command RCMD3, the memory device 110 reads data from a page in the memory device 110, and caches third data DATA_3, as the read data, in the cache buffer CBUF (① tR).

At this time, first data DATA_1, as the data read in the read retry operation for the first read command RCMD1, is in a state in which it is previously stored in the cache buffer CBUF. The memory device 110 may simultaneously execute an operation of caching the third data DATA_3 in the cache buffer CBUF and an operation (②dout) of outputting the first data DATA_1, previously stored in the cache buffer CBUF, to the memory controller 120.

In this way, by executing the read retry operation for the first read command RCMD1 in an overlapping manner with a read operation for another read command, the memory device 110 may prevent read performance from decreasing even in the case where a read failure for the first read command RCMD1 occurs.

Figure 11:
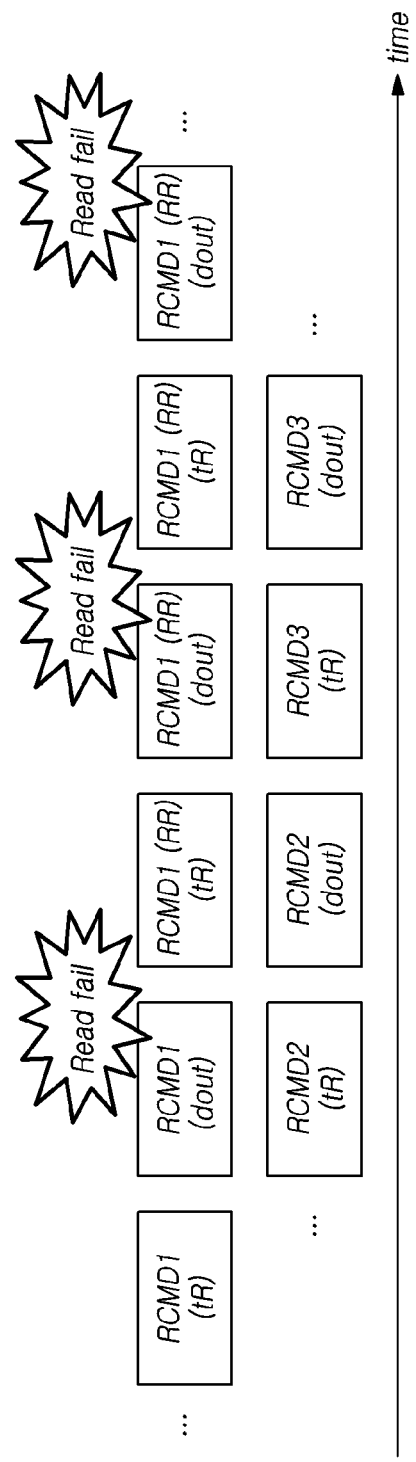
FIG. 11 is a diagram illustrating an example in which a memory device based on an embodiment of the present disclosure repeatedly executes a read retry operation for a first read command.

FIG. 11 is a diagram illustrating an example in which a memory device 110 based on an embodiment of the present disclosure repeatedly executes a read retry operation for a first read command RCMD1. The operation of FIG. 11 may be performed under the control of the control logic 240 in FIG. 2.

Referring to FIG. 11, the memory device 110 may repeatedly execute the read retry operation for the first read command RCMD1 until the read retry operation for the first read command RCMD1 succeeds.

In FIG. 11, when a read failure occurs during a read operation for the first read command RCMD1, the memory device 110 may execute the read retry operation for the first read command RCMD1.

In the case where a read failure occurs again during the read retry operation for the first read command RCMD1, the memory device 110 may re-execute the read retry operation for the first read command RCMD1.

In the meantime, while repeatedly executing the read retry operation for the first read command RCMD1, the memory device 110 may simultaneously execute another read command, inputted from the memory controller 120, in an overlapping manner, thereby minimizing a decrease in the read performance due to a read failure.

Figure 12:
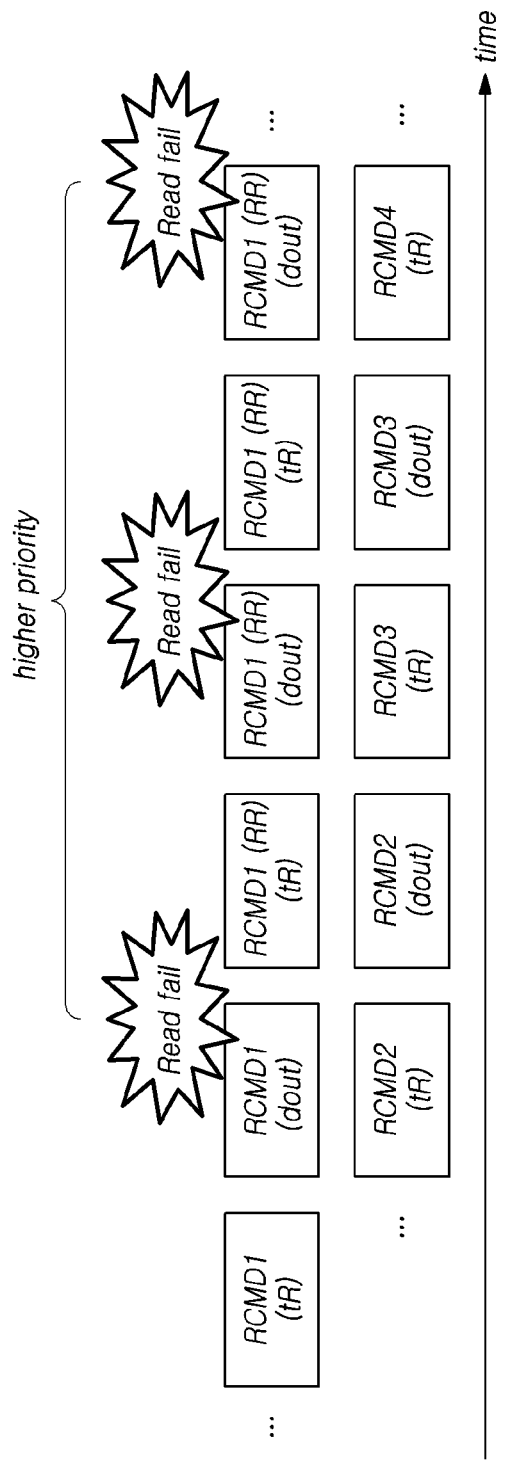
FIG. 12 is a diagram illustrating a priority with which a memory device based on an embodiment of the present disclosure executes a read retry operation for a first read command.

FIG. 12 is a diagram illustrating a priority with which a memory device 110 based on an embodiment of the present disclosure executes a read retry operation (RR) for a first read command RCMD1. The operation of FIG. 12 may be performed under the control of the control logic 240 in FIG. 2.

Referring to FIG. 12, the memory device 110 may execute the read retry operation for the first read command RCMD1, with a higher priority than a read command inputted after the first read command RCMD1 among a plurality of read commands inputted from the memory controller 120.

Through this, the memory device 110 may prevent the read retry operation for the first read command RCMD1 from being delayed by an operation of executing another read command. The memory device 110 may execute the read retry operation for the first read command RCMD1 earlier than the operation of executing the another read command, so that a response to the first read command RCMD1 may be outputted to the memory controller 120 possibly earlier than a response to a read command inputted after the first read command RCMD1.

In this case, while executing the read retry operation for the first read command RCMD1, the memory device 110 may simultaneously execute an operation of executing one of read commands (e.g., RCMD2, RCMD3 or RCMD4) inputted after the first read command RCMD1.

Figure 13:
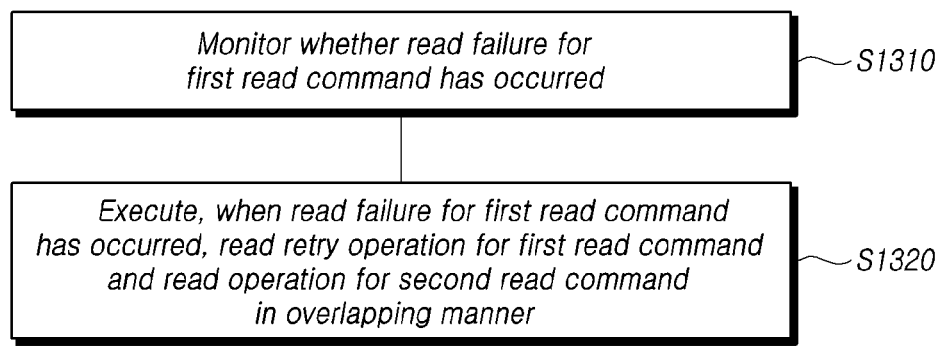
FIG. 13 is a diagram illustrating a method for operating a memory device based on an embodiment of the present disclosure.

FIG. 13 is a diagram illustrating a method for operating a memory device 110 based on an embodiment of the present disclosure.

Referring to FIG. 13, the method for operating the memory device 110 may include monitoring whether a read failure for a first read command RCMD1 among a plurality of read commands RCMD inputted from the memory controller 120 has occurred (S1310).

Further, the method for operating the memory device 110 may include executing, when a read failure for the first read command RCMD1 has occurred, a read retry operation for the first read command RCMD1 and a read operation for a second read command RCMD2 among the plurality of read commands RCMD, in an overlapping manner (S1320).

For example, at S1320, an operation of storing first data DATA_1, as data read in the read retry operation for the first read command RCMD1, in the cache buffer CBUF and an operation of outputting second data DATA_2, as data read-requested by the second read command RCMD2, to the memory controller 120 may be simultaneously executed.

The second data DATA_2 may be in a state in which it is previously stored in the cache buffer CBUF, when the read retry operation for the first read command RCMD1 is started.

The method for operating the memory device 110 may further include simultaneously executing an operation of outputting the first data DATA_1 to the memory controller 120 and an operation of storing third data DATA_3, as data read-requested by a third read command RCMD3 among the plurality of read commands RCMD, in is the cache buffer CBUF.

Moreover, the read retry operation for the first read command RCMD1 may be repeatedly executed until the read retry operation for the first read command RCMD1 succeeds. The read retry operation for the first read command RCMD1 may be executed with a higher priority than a read command inputted after the first read command RCMD1 among the plurality of read commands RCMD.

Figure 14:
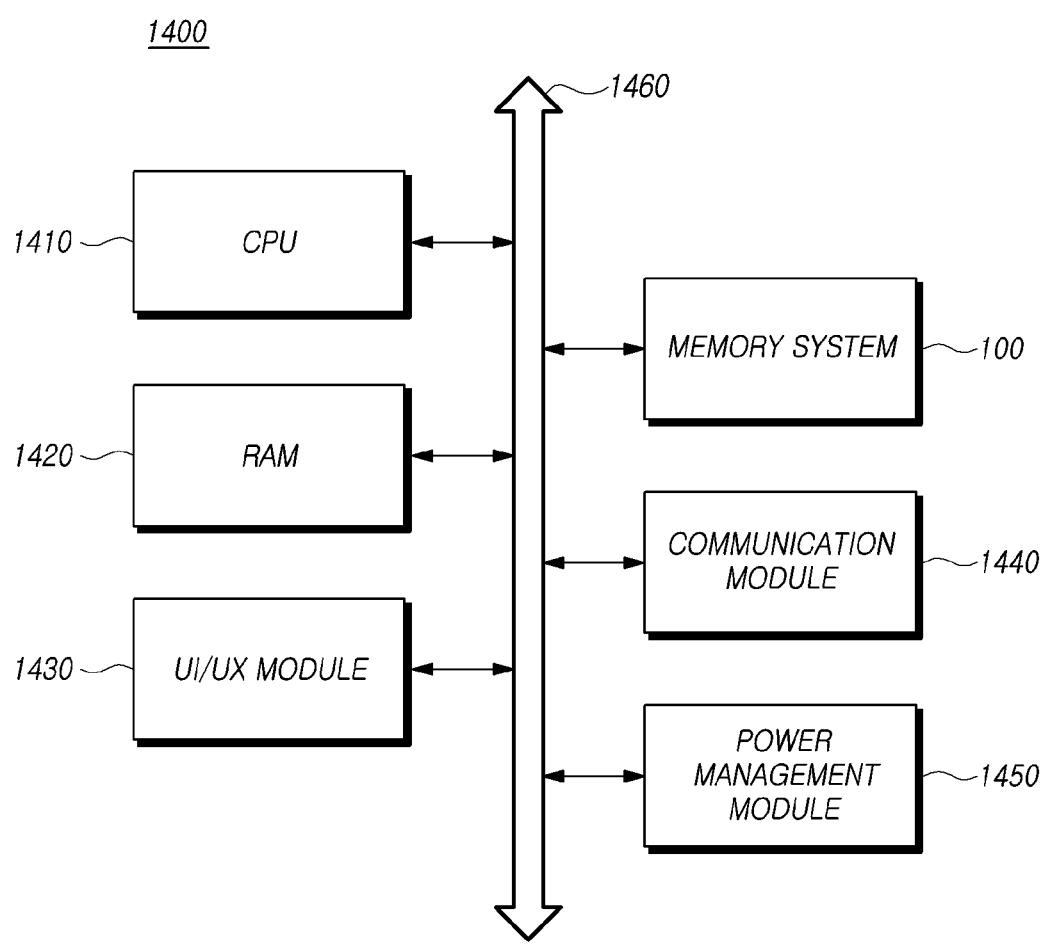
FIG. 14 is a diagram illustrating the configuration of a computing system based on some embodiments of the present disclosure.

FIG. 14 is a diagram illustrating the configuration of a computing system 1400 based on an embodiment of the present disclosure.

Referring to FIG. 14, the computing system 1400 based on an embodiment of the present disclosure may include: a memory system 100 electrically connected to a system bus 1460; a central processing unit (CPU) 1410 configured to control the overall operation of the computing system 1400; a random access memory (RAM) 1420 configured to store data and information related to operations of the computing system 1400; a user interface/user experience (UI/UX) module 1430 configured to provide the user with a user environment; a communication module 1440 configured to communicate with an external device as a wired and/or wireless type; and a power management module 1450 configured to manage power used by the computing system 1400.

The computing system 1400 may be a personal computer (PC) or may include a mobile terminal such as a smartphone, a tablet or various electronic devices.

The computing system 1400 may further include a battery for supplying an operating voltage, and may further include an application chipset, a graphic-related module, a camera image processor, and a dynamic random access memory (DRAM). Other additional elements would be apparent to a person skilled in the art.

The memory system 100 may include not only a device configured to store data in a magnetic disk such as a hard disk drive (HDD), but also a device configured to store data in a nonvolatile memory such as a solid state drive (SSD), a universal flash storage device, or an embedded MMC (eMMC) device. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. In addition, the memory system 100 may be implemented as storage devices of various types and mounted inside various electronic devices.

Based on embodiments of the present disclosure described above, the operation delay time of the memory system may be advantageously reduced or minimized. In addition, based on an embodiment of the present disclosure, an overhead occurring in the process of calling a specific function may be advantageously reduced or minimized. Although various embodiments of the present disclosure have been described with particular specifics and varying details for illustrative purposes, those skilled in the art will appreciate that various modifications, additions and substitutions may be made based on what is disclosed or illustrated in the present disclosure.

Furthermore, the embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein and the following claims. The embodiments may be combined to form additional embodiments.

What is claimed is:

1. A memory device comprising:
   a memory cell array;
   a read/write circuit configured to read data stored in the memory cell array; and
   a control logic configured to control the read/write circuit to execute a plurality of read commands inputted from a memory controller,
   wherein, when a read failure for a first read command among the plurality of read commands occurs, the memory device executes, in an overlapping manner, a read retry operation for the first read command and a read operation for a second read command among the plurality of read commands.

2. The memory device according to claim 1, further comprising: a cache buffer capable of caching data read-requested by the plurality of read commands,
   wherein the memory device simultaneously executes an operation of caching first data as data read in the read retry operation for the first read command, in the cache buffer and an operation of outputting second data as data read-requested by the second read command, to the memory controller.

3. The memory device according to claim 2, wherein the second data is previously stored in the cache buffer, when the read retry operation for the first read command is started.

4. The memory device according to claim 2, wherein the memory device simultaneously executes an operation of outputting the first data to the memory controller and an operation of caching third data as data read-requested by a third read command among the plurality of read commands, in the cache buffer.

5. The memory device according to claim 1, wherein the memory device repeatedly executes the read retry operation for the first read command until the read retry operation for the first read command succeeds.

6. The memory device according to claim 5, wherein the memory device executes the read retry operation for the first read command with a higher priority than a read command inputted after the first read command among the plurality of read commands.

7. A method for operating a memory device executing a plurality of read commands inputted from a memory controller, the method comprising:
   monitoring whether a read failure for a first read command among the plurality of read commands has occurred; and
   executing, when a read failure for the first read command has occurred, a read retry operation for the first read command and a read operation for a second read command among the plurality of read commands in an overlapping manner.

8. The method according to claim 7, wherein the executing of the read retry operation for the first read command and the read operation for the second read command in the overlapping manner includes:
   simultaneously executing an operation of storing first data, as data read in the read retry operation for the first read command, in a cache buffer capable of caching data read-requested by the plurality of read commands and an operation of outputting second data as data read-requested by the second read command, to the memory controller.

9. The method according to claim 8, wherein the second data is previously stored in the cache buffer, when the read retry operation for the first read command is started.

10. The method according to claim 8, further comprising:
    simultaneously executing an operation of outputting the first data to the memory controller and an operation of storing third data as data read-requested by a third read command among the plurality of read commands, in the cache buffer.

11. The method according to claim 7, wherein the read retry operation for the first read command is repeatedly executed until the read retry operation for the first read command succeeds.

12. The method according to claim 11, wherein the read retry operation for the first read command is executed with a higher priority than a read command inputted after the first read command among the plurality of read commands.

13. A memory device comprising:
    a memory cell array including a plurality of pages;
    a cache buffer; and
    a control logic configured to:
    receive, from a memory controller, a plurality of read commands associated with the plurality of pages;
    sequentially execute first and second read commands among the plurality of read commands to read first and second data from first and second pages among the plurality of pages and cache first and second read data in the cache buffer;
    determine whether a read failure for the first read data has occurred; and
    when it is determined the read failure for the first read data occurred, execute a read retry for the first page to read the first read data and cache the first read data in the cache buffer while transferring the second read data, which is cached in the cache buffer, to the memory controller.

* * * * *